United States Patent
Amano

(10) Patent No.: US 7,952,683 B2
(45) Date of Patent: May 31, 2011

(54) EXPOSURE APPARATUS AND DEVICE MANUFACTURING METHOD

(75) Inventor: Toshitaka Amano, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 546 days.

(21) Appl. No.: 11/852,953

(22) Filed: Sep. 10, 2007

(65) Prior Publication Data

US 2008/0062392 A1    Mar. 13, 2008

(30) Foreign Application Priority Data

Sep. 11, 2006  (JP) ................ 2006-245403

(51) Int. Cl.
  *G03B 27/68* (2006.01)
(52) U.S. Cl. ........................................... 355/52
(58) Field of Classification Search ............ 355/53, 355/52, 55
  See application file for complete search history.

(56) References Cited

U.S. PATENT DOCUMENTS

| | | | |
|---|---|---|---|
| 5,581,324 A | 12/1996 | Miyai et al. | |
| 6,018,384 A * | 1/2000 | Ota | 355/53 |
| 6,235,438 B1 | 5/2001 | Suzuki et al. | |
| 6,563,564 B2 * | 5/2003 | de Mol et al. | 355/52 |
| 2002/0033935 A1 * | 3/2002 | Ohsaki | 355/52 |
| 2006/0044536 A1 * | 3/2006 | Ohsaki | 355/52 |

FOREIGN PATENT DOCUMENTS

| | | |
|---|---|---|
| JP | 07-029802 | 1/1995 |
| JP | 10-247617 | 9/1998 |
| JP | 11-195602 | 7/1999 |

* cited by examiner

*Primary Examiner* — Edward J Glick
*Assistant Examiner* — Deoram Persaud
(74) *Attorney, Agent, or Firm* — Canon USA Inc IP Division

(57) ABSTRACT

An exposure apparatus includes a projection optical system, an original stage having a first reference mark, a substrate stage, and a measurement instrument configured to measure first image properties of a mark formed on the original with the projection optical system, via the original and the projection optical system. The measurement instrument is also configured to measure the properties of a second image with the projection optical system of the first reference mark, via the reference mark and the projection optical system. The exposure apparatus also includes a calculating unit for calculating a first heat change coefficient due to the projection optical system and a second heat change coefficient due to the original, with relation to the properties of images formed by the projection optical system.

4 Claims, 9 Drawing Sheets

EXPOSURE APPARATUS AND DEVICE MANUFACTURING METHOD

BACKGROUND OF THE INVENTION

1. Field of the Invention

The present invention relates to an exposure apparatus for manufacturing devices having minute patterns, such as semiconductor chips (like ICs, LSIs, and the like), liquid crystal panels, CCDs, thin-film magnetic heads, micro-machines, and so forth.

2. Description of the Related Art

With exposure processing using semiconductor exposure apparatuses, change in magnification of the projection optical system and reticle due to exposure heat, and change in focal point of the projection optical system, are calculated from exposure results, and change coefficients are calculated from the amount of heat and the like applied to the projection optical system and reticle during the exposure process. Now, in a case of subjecting a projection optical system and reticle to exposure processing, and calculating a heat change coefficient from the exposure load and exposure results, a change coefficient for both the projection optical system and reticle together can be obtained. On the other hand, in a case of periodically measuring the amount of change between exposure processes using a so-called reticle reference plate disposed at an optically equivalent position as that of the reticle, from which a heat change coefficient is calculated, a change coefficient can be obtained for the projection optical system alone.

Minute devices of recent years require high-precision change correction regarding magnification, focal position, and so forth. Also, there is a need for even stricter restriction on the amount of fluctuation permitted for each correction value. On the other hand, the amount of time allowed for measurement processes other than the exposure process is being reduced, in order to improve productivity.

SUMMARY OF THE INVENTION

The present invention is directed to an exposure apparatus and method thereof whereby deterioration in productivity can be suppressed and exposure precision can be improved.

According to a first aspect of the present invention, an exposure apparatus configured to expose a substrate via an original includes: a projection optical system configured to project light from the original onto the substrate; an original stage having a first reference mark, the original stage being configured so as to hold the original and to move; a substrate stage configured so as to hold the substrate and to move; a measurement instrument configured to measure first image properties of a mark formed on the original held by the original stage with the projection optical system, via the original and the projection optical system, and measure the properties of a second image with the projection optical system of the first reference mark, via the reference mark and the projection optical system; a calculating unit configured to calculate a first heat change coefficient due to the projection optical system and a second heat change coefficient due to the original, with relation to the properties of images formed by the projection optical system, based on the properties of the first image and the properties of the second image measured by the measurement instrument; and a compensation unit configured to compensate for change of the properties of images formed by the projection optical system, in accordance with the first heat change coefficient and the second heat change coefficient calculated by the calculating unit.

According to a second aspect of the present invention, an exposure apparatus configured to expose a substrate via an original includes: a projection optical system configured to project light from the original onto the substrate; an original stage configured so as to hold the original and to move; a substrate stage configured so as to hold the substrate and to move; a measurement instrument configured to measure first image properties of a mark formed on a first original held by the original stage with the projection optical system, via the first original and the projection optical system, and measure second image properties of a mark formed on a second original held by the original stage with the projection optical system, via the second original and the projection optical system; a calculating unit configured to calculate a first heat change coefficient due to the projection optical system and a second heat change coefficient due to the first original, with relation to the properties of images formed by the projection optical system, based on the properties of the first image and the properties of the second image measured by the measurement instrument; and a compensation unit configured to compensate for change of the properties of images formed by the projection optical system, in accordance with the first heat change coefficient and the second heat change coefficient calculated by the calculating unit.

Note that in the present specification, the term "heat change coefficient" refers to, for example, focus change coefficient, shift change coefficient, tilt change coefficient, image field (focal position) change coefficient, distortion change coefficient, and various types of aberration change coefficients.

According to the present invention, deterioration in productivity can be suppressed while improving exposure precision.

Further features of the present invention will become apparent from the following description of exemplary embodiments with reference to the attached drawings.

DESCRIPTION OF THE EMBODIMENTS

An exposure apparatus according to embodiments of the present invention will now be described.

Figure 1:
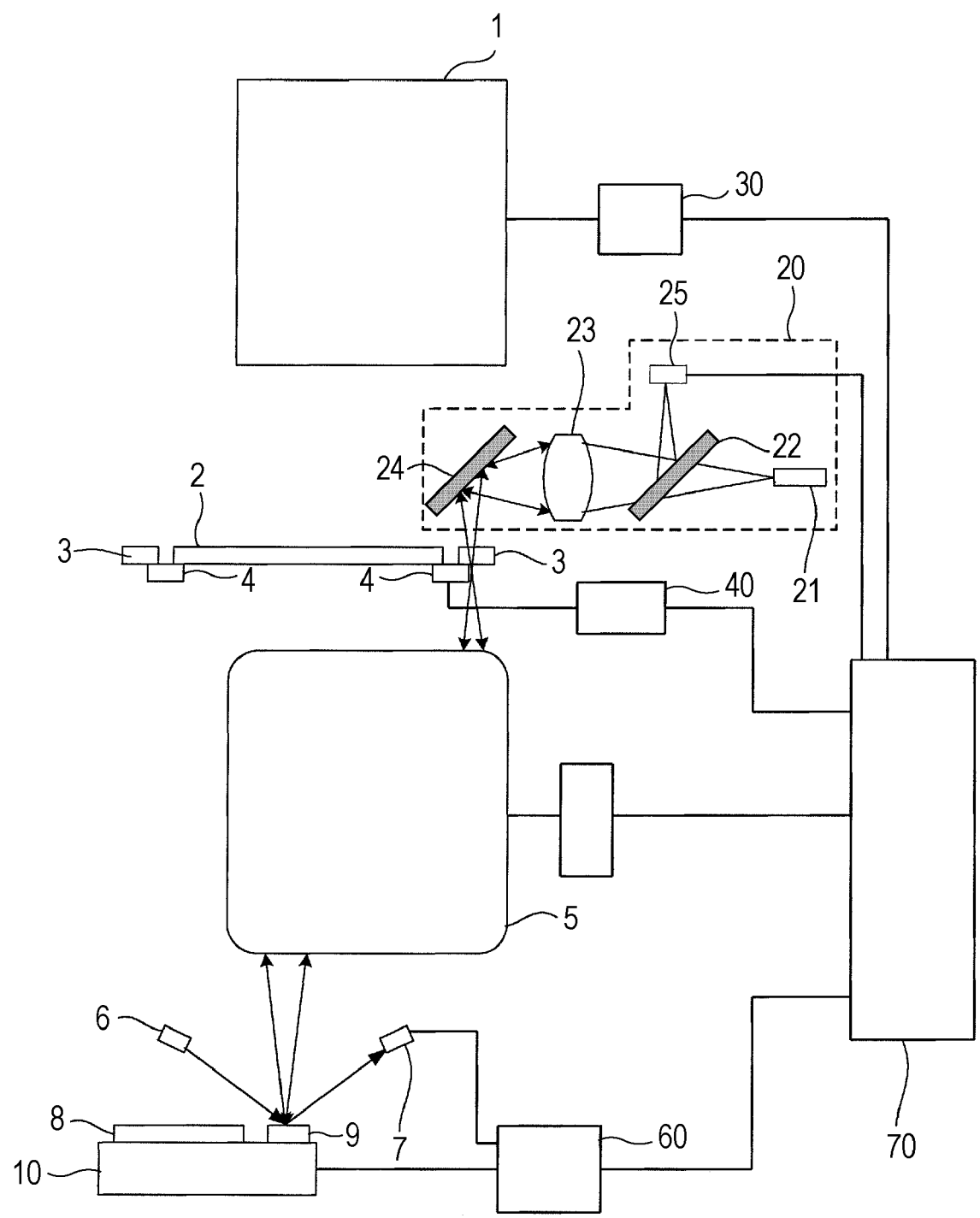
FIG. 1 is a schematic drawing of an exposure apparatus according to an embodiment of the present invention.

FIG. 1 is a schematic drawing of the configuration of an exposure apparatus according to an embodiment of the present invention. When performing exposure wherein a circuit pattern on a reticle (original) is transferred onto a wafer (substrate), instructions from an exposure apparatus control system 70 are transmitted to a light source control system 30, and the operations of an exposure light source 1 are controlled by instructions from the light source control system 30.

An unshown illumination optical system for changing the shape and so forth of the illumination light is configured between the exposure light source 1 and a reticle stage (original stage) 4. Inside of the illumination light system is purged with a gas such as $N_2$, to stabilize image forming performance. An unshown flow meter is configured near the inlet or vent for the gas, to monitor the flow of the gas. Further configured within the illumination optical system are a pressure gauge for monitoring the pressure, and a thermometer for monitoring the temperature of the atmosphere within the illumination optical system. Moreover, a thermometer is configured for monitoring the temperature of the atmosphere within the illumination optical system and the temperature of the atmosphere between the illumination optical system and the reticle stage 4.

A reticle 2 is held on the reticle stage 4. While a reticle reference plate 3 is held at the reticle stage 4 in the arrangement shown in FIG. 1, the reticle reference plate 3 may be fixed at a separate position, which is optically equivalent to that of the reticle 2. Various types of reference marks (not shown) are provided on the reticle reference plate 3. With a scanning exposure apparatus, the reticle stage 4 can be moved in the optical axis direction (z-axis) of a projection optical system 5, the directions orthogonal thereto (x-axis and y-axis), and rotated as to the optical axis.

Driving control of the reticle stage 4 is performed by an instruction from the exposure apparatus control system 70 being transmitted to a reticle stage control system 40, and driving control of the reticle control being performed under instructions of the reticle stage control system 40. The position of the reticle stage 4 is measured by an unshown position detecting system, such as a laser interferometer, encoder, or the like. Further, the reticle stage 4 is cooled by an unshown mechanism for circulating a fluid such as purified water or the like, or an unshown mechanism for directly blowing air or the like, in order to suppress heat generation of the reticle stage 4 itself. Also provided here are a flow meter for monitoring the flow of fluid or air, a thermometer for monitoring temperature, and so forth.

The projection optical system 5 is configured of multiple lenses, and operates to form an image of the circuit pattern on the reticle onto a wafer 8 when performing exposure, at a scale corresponding to the reduction rate of the projection optical system 5. The projection optical system 5 has also configured an unshown position detecting system such as a laser interferometer, encoder, or the like, to measure the position of each lens. Further, the projection optical system 5 includes an unshown thermometer for monitoring the temperature of the atmosphere within the projection optical system 5, and an unshown pressure gauge for monitoring the atmosphere pressure. The projection optical system 5 is cooled by an unshown mechanism for circulating a fluid such as purified water or the like, or an unshown mechanism for directly blowing air or the like, in order to disperse heat absorbed by the lenses. Also provided here are a flow meter for monitoring the flow of fluid or air and a flow meter for monitoring gas purging of $N_2$ or the like for stabilizing image-forming or the like at this time.

A TTR observation optical system 20 can be a Through The Reticle type observation optical system. An illumination light flux emitted from a fiber 21 passes through a one-way mirror 22, passes through an object lens 23 and is reflected off of a mirror 24, and is condensed near the reticle reference plate 3 (or the reticle 2). The illumination light flux condensed near the reticle reference plate 3 (or the reticle 2) is condensed on a stage reference plate 9 via the projection optical system 5. Reflected light from the stage reference plate 9 returns along the same optical path, via the projection optical system 5, the reticle reference plate 3 (or the reticle 2), the mirror 24, the object lens, in that order, is reflected off of the one-way mirror 22 and is cast into an image pickup device 25.

An unshown relay lens for changing the focal position as to an observation face is built into the TTR observation optical system 20. The TTR observation optical system 20 has a thermometer for monitoring the temperature of the atmosphere, and a pressure gauge for monitoring the pressure of the atmosphere. The TTR observation optical system 20 also has a mechanism for circulating a fluid such as purified water or the like, or an unshown mechanism for directly blowing air or the like, in order to disperse heat absorbed by the object and relay lenses. Flow meters are provided to monitor the flow of the fluid and gas, as well as a flow meter for monitoring the flow of a gas such as $N_2$, with which the system is purged to stabilize image forming performance. The TTR observation optical system 20 also has configured a position detecting system such as a laser interferometer, encoder, or the like, to measure the position of the object and relay lenses.

An off-axis auto-focus optical system is configured of a projection optical system 6 and a detection optical system 7. The projection optical system 6 emits non-exposure light in the form of a light flux, which is condensed at a point on the stage reference plate 9 (or upper face of the wafer 8). The reflected light flux is cast into the detection optical system 7. An unshown position detection photo detector is disposed within the detection optical system 7, configured so as to conjugate the position detection photo detector and the point of reflection of the light flux on the stage reference plate 9. Positional offset of the stage reference plate 9 as to the direction of the optical axis of the projection optical system 5 is measured as positional offset of the incident light flux to the position detection photo detector within the detection optical system 7.

A mark drawn on the reticle 2 or a mark drawn on the reticle reference plate 3 is illuminated by an exposure light flux emitted from the exposure light source 1 via the illumination light system or the TTR observation optical system 20. The mark drawn on the reticle 2 or the mark drawn on the reticle reference plate 3 is illuminated on the stage reference plate 9, and an unshown mark corresponding to the pattern image formed by way of the projection optical system 5 is formed. The positional offset of the stage reference plate 9 as to the predetermined reference face, measured by the detection optical system 7, is transmitted to a wafer stage control system 60.

When performing focus calibration measurement, the wafer stage control system 60 performs vertical driving of the projection optical system 5 in the optical axis direction (Z-axial direction) of the projection optical system, near a predetermined reference position. Positional control of the wafer 8 is also performed when exposition.

Further configured is an unshown off-axis type off-axis observation optical system capable of observing and measuring the wafer surface with non-exposure light. The off-axis observation optical system is configured with a thermometer for monitoring the temperature of the atmosphere and a pressure gauge for monitoring the atmosphere pressure. The exposure apparatus control system 70 performs high-precision exposure by controlling correction of the units based on the correction values.

Specific embodiments of the present invention will now be described. The first through fifth embodiments of the present invention relate to a specific measurement method for performing measurement wherein the heat change amount of the projection optical system and the heat change amount of the reticle are separated and measured, with the exposure apparatus shown in FIG. 1.

First Embodiment

Figure 2:
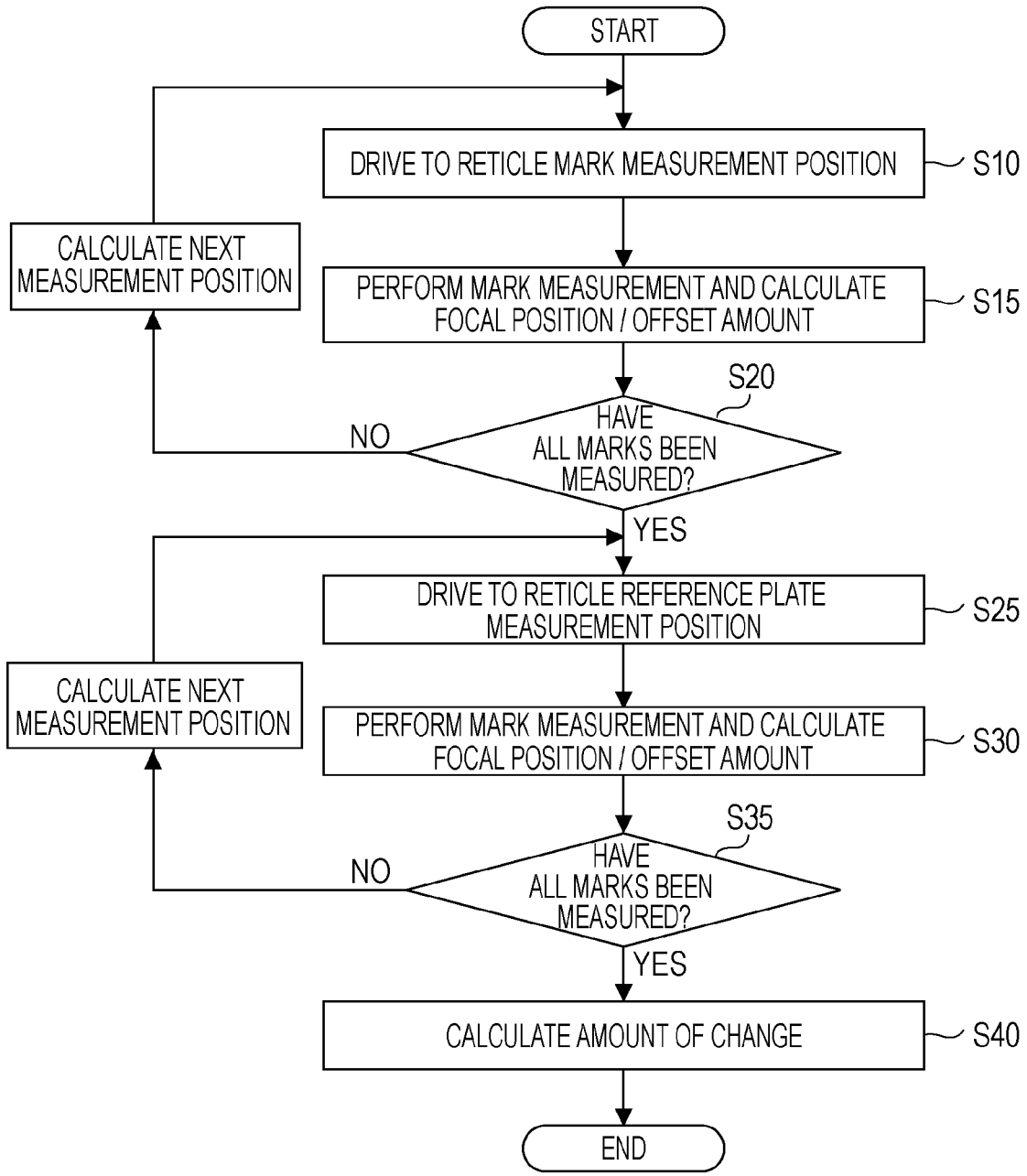
FIG. 2 is a diagram illustrating a heat amount change measurement sequence for a projection optical system and reticle, according to a first embodiment of the present invention.

FIG. 2 illustrates a measurement sequence for performing separated measurement of the heat change amount of the projection optical system 5 and the heat change amount of the reticle 2.

In step S10, units necessary for measurement, such as the reticle stage 4, a wafer stage 10, illumination optical system, the projection optical system 5, and so forth, are driven to the measurement position of a measurement mark drawn on the reticle 2.

In step S15, the mark (features of first image) is measured. Measurement values include focal position, planar direction positional offset amount, and so forth.

In step S20, confirmation is made regarding whether or not measurement of all marks has been completed, and in the event that measurement of all marks has not ended, the next measurement position is calculated from coordinate information of the next measurement mark, and the flow returns to step S10. The total number of marks can be changed according to the items regarding which amount of change is to be measured. For example, one mark for measuring the amount of change in focus or shift (offset), two marks in the case of measuring the amount of change in tilt or change in magnification, and three marks in the case of measuring the amount of change in field or the amount of change in distortion.

In step S25, units necessary for measurement, such as the reticle stage 4, the wafer stage 10, illumination optical system, the projection optical system 5, and so forth, are driven to the measurement position of a measurement mark (first reference mark) drawn on the reticle reference plate 3.

In step S30, the mark (features of second image) is measured. Measurement values include focal position, planar direction positional offset amount, and so forth.

In step S35, confirmation is made regarding whether or not measurement of all marks has been completed, and in the event that measurement of all marks has not ended, the next measurement position is calculated from coordinate information of the next measurement mark, and the flow returns to step S25. Measurement needs to be completed in a short time, to reduce heat change during measurement. Accordingly, the number of measurement marks on the reticle 2 and the number of measurement marks on the reticle reference plate 3 should be optimized.

In step S40, the heat change amount is calculated for the projection optical system 5 and the reticle 2. The measurement values (property values of first image) obtained by measurement of the marks on the reticle include both the heat change amount of the projection optical system and the heat change amount of the reticle. On the other hand, the measurement values (property values of second image) obtained by measurement of the marks on the reticle reference plate 3 include only the heat change amount of the projection optical system. While the actual measurement values include other components such as measurement error margin, wafer-stage side measurement error, and so forth, these other components are error components also included in the reticle mark measurement and reticle reference mark measurement, and accordingly can be disregarded here.

Calculation of the heat change amount is performed as follows.

Reticle mark measurement results=reticle heat change amount+projection optical system heat change amount (Expression 1)

Reticle reference plate mark measurement results=projection optical system heat change amount (Expression 2)

From Expressions 1 and 2, we find that

Reticle heat change amount=reticle mark measurement results−reticle reference plate mark measurement results (Expression 3)

holds, and that the reticle heat change amount and projection optical system heat change amount can be calculated in a separated manner from Expressions 2 and 3.

Second Embodiment

Figure 3:
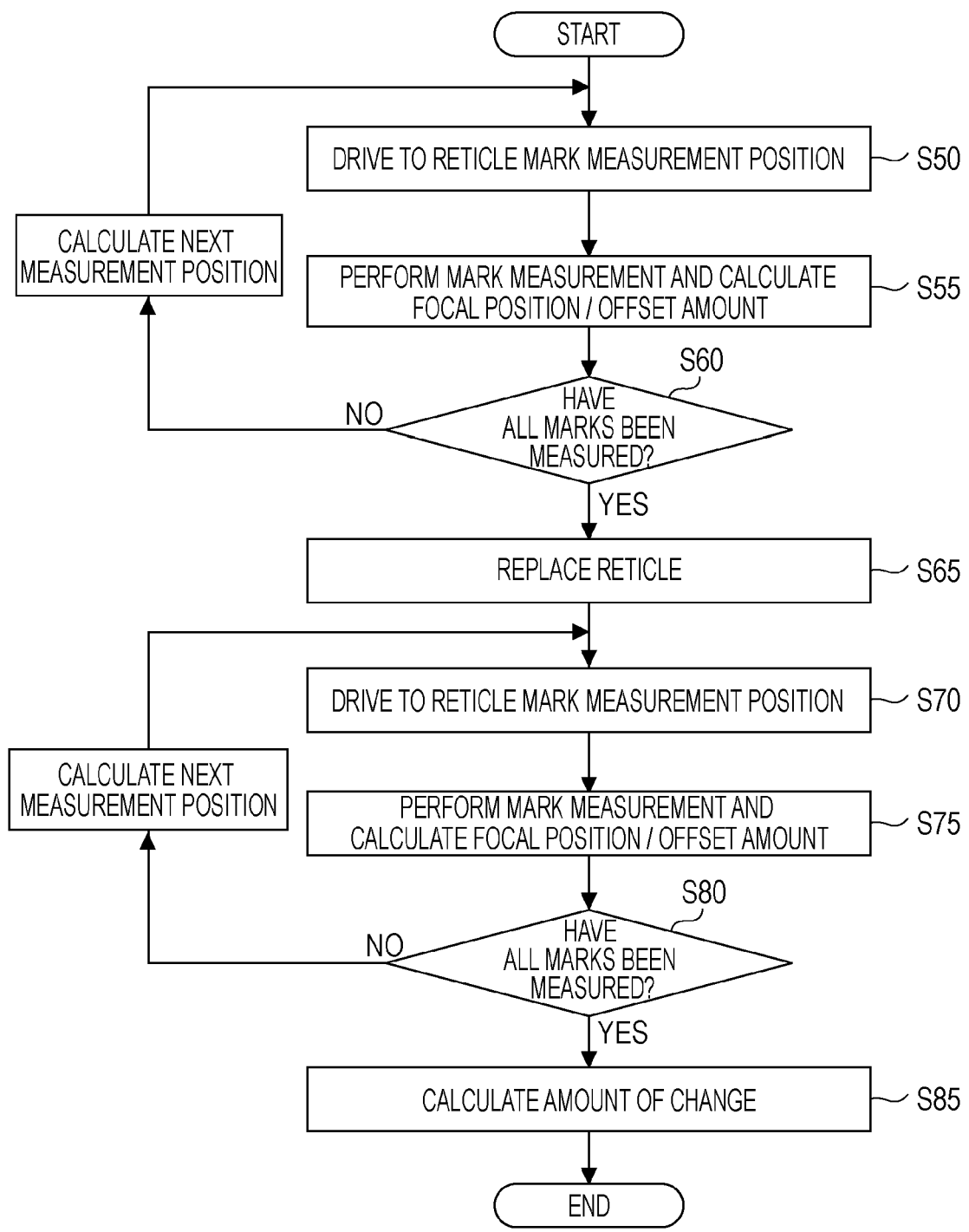
FIG. 3 is a diagram illustrating a heat amount change measurement sequence for a projection optical system and reticle, according to a second embodiment of the present invention.

FIG. 3 illustrates a measurement sequence for performing separated measurement of the heat change amount of the projection optical system 5 and the heat change amount of the reticle 2, using two reticles.

In step S50, units necessary for measurement, such as the reticle stage 4, the wafer stage 10, illumination optical system, the projection optical system 5, and so forth, are driven to the measurement position of a measurement mark drawn on the reticle 2, which takes the heat load (first original).

In step S55, the mark (features of first image) is measured. Measurement values include focal position, planar direction positional offset amount, and so forth.

In step S60, confirmation is made regarding whether or not measurement of all marks has been completed, and in the event that measurement of all marks has not ended, the next measurement position is calculated from coordinate information of the next measurement mark, and the flow returns to step S50. The total number of marks can be changed according to the items regarding which amount of change is to be measured. For example, one mark for measuring the amount of change in focus or shift (offset), two marks in the case of measuring the amount of change in tilt or change in magnification, and three marks in the case of measuring the amount of change in field or the amount of change in distortion.

In step S65, the reticle 2 is replaced. Replacing with a reticle which is not affected by exposure heat at this time allows measurement of thermal deformation of the projection optical system 5 alone when performing reticle mark measurement.

In step S70, units necessary for measurement, such as the reticle stage 4, the wafer stage 10, illumination optical system, the projection optical system 5, and so forth, are driven to the measurement position of a measurement mark drawn on a reticle which has not been subjected to heat load (second original).

In step S75, the mark (features of second image) is measured. Measurement values include focal position, planar direction positional offset amount, and so forth.

In step S80, confirmation is made regarding whether or not measurement of all marks has been completed, and in the event that measurement of all marks has not ended, the next measurement position is calculated from coordinate information of the next measurement mark, and the flow returns to step S70. Measurement needs to be completed in a short time, to reduce heat change during measurement. Accordingly, the number of measurement marks on the reticle 2 should be optimized.

In step S85, the heat change amount is calculated for the projection optical system 5 and the reticle 2. The measurement values (property values of first image) obtained by measurement of the marks on the reticle subjected to heat change include both the heat change amount of the projection optical system and the heat change amount of the reticle. On the other hand, the measurement values (property values of second image) obtained by measurement of the marks on the reticle not subjected to heat change include only the heat change amount of the projection optical system. While the actual measurement values include other components such as measurement error margin, wafer-stage side measurement error, and so forth, these other components are error components also included in mark measurement of the reticle subjected to heat change and mark measurement of the reticle not subjected to heat change, and accordingly can be disregarded here.

Calculation of the heat change amount is performed as follows.

Measurement results for reticle subjected to heat load=reticle heat change amount+projection optical system heat change amount    (Expression 4)

Measurement results for reticle not subjected to heat load=projection optical system heat change amount    (Expression 5)

From Expressions 4 and 5, we find that

Reticle heat change amount=measurement results for reticle subjected to heat load−measurement results for reticle not subjected to heat load    (Expression 6)

holds, and that the reticle heat change amount and projection optical system heat change amount can be calculated independently from Expressions 5 and 6.

While there is no particular restriction regarding the measurement arrangement used in FIGS. 2 and 3, both the reticle reference plate marks and reticle marks should be able to be measured in a short time with the same configuration.

Description will now be made regarding a detailed measurement method. As a preparation before measurement, a mark to be measured is driven to the measurement position. This driving is performed by driving the reticle reference plate 3 and the stage reference plate 9 in the case of measurement of a mark on the reticle reference plate, and driving the mark on the reticle 2 and the stage reference plate in the case of measurement of the mark on the reticle.

Third Embodiment

Figure 4:
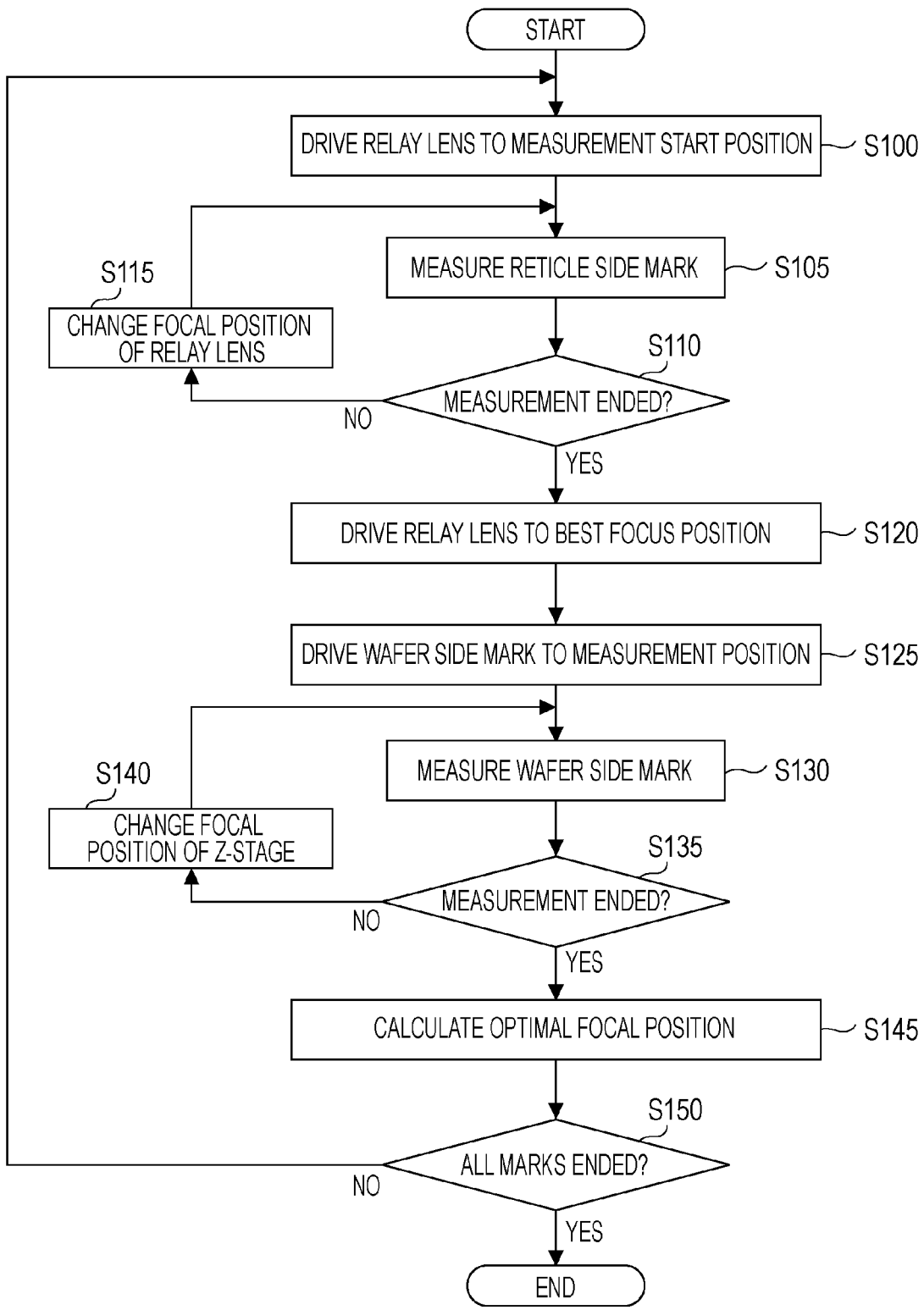
FIG. 4 is a diagram illustrating a focal position measurement sequence using a TTR observation optical system, according to a third embodiment of the present invention.

FIG. 4 is a diagram illustrating a focal position measurement sequence in a case of using the TTR observation optical system 20 shown in FIG. 1 as a measurement arrangement. We will assume that the object lens of the TTR observation optical system has been driven (not shown in FIG. 4) as to the measurement mark as a preparation to measurement with the TTR observation optical system, and that measurement preparations have been completed.

In step S100, the relay lens within the TTR observation optical system is driven to the measurement start position.

In step S105, measurement of the reticle side mark is executed. This measurement is preformed by light quantity or image measurement, using reflected light from the reticle side mark illuminated by the illumination system within the TTR observation optical system.

In step S110, in the event that measurement of the reticle side marks has not been completed, the focal position of the relay lens is changed in step S115, and steps S105 and 110 are repeated until the measurement is complete.

In step S120, the focal position of the TTR observation optical system 20 as to the reticle side mark is calculated based on the reticle side mark measurement results that have been completed, and driving is performed to the focal position (BF (Best Focus) position).

Note that while the processing of step S100 through S110 obtain the BF position of the TTR observation optical system 20 as to the reticle side mark, this may be omitted in a case wherein the relation of the two is perpetually unchanged.

In step S125, the wafer side mark is driven to the measurement position. The reason that the wafer side mark is driven to the measurement position here is because at the time of executing the processing of steps S100 through S110, if the wafer side mark face is below the TTR observation optical system 20, reflected light from the wafer face undesirably enters the TTR observation optical system. To avoid this, the wafer stage must be temporarily driven to a position where there is no reflecting face. Accordingly, in the event of omitting steps S100 through S110, step S125 can be omitted as well.

In step S130, measurement of the wafer side mark is performed. The measurement here performs light quantity or image measurement, using reflected light from the wafer side make illuminated by the illumination system within the TTR observation optical system 20.

In step S135, in the event that measurement of the wafer side marks has not been completed, the focal position of the waver Z stage is changed in step S140, and steps S130 and S135 are repeated until the measurement is complete.

In step S145, the focal position of the wafer side mark as to the reticle side mark is calculated based on the wafer side mark measurement results that have been completed, and the focal position is calculated.

In step S150, confirmation is made regarding whether measurement has been completed for all marks to be measured. In the event that measurement of all marks has not been completed, the reticle stage 4, the wafer stage 10, and object lens of the TTR observation optical system 20 are driven, and the flow returns to step S100.

The focal position measurement sequence using the TTR observation optical system 20 shown in FIG. 4 is a sequence for measuring both reticle marks and reticle reference plate marks.

Fourth Embodiment

Figure 5:
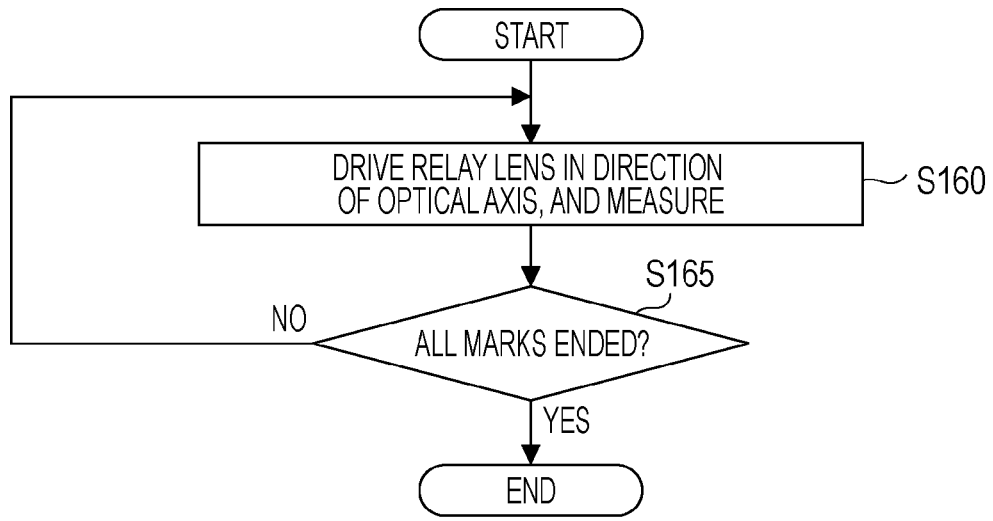
FIG. 5 is a diagram illustrating a focal position measurement sequence using a TTR observation optical system, according to a fourth embodiment of the present invention.

FIG. 5 shows a focal position measurement sequence using the TTR observation optical system 20. The difference from that shown in FIG. 4 is that the reticle side mark and wafer side mark are driven to a position so as to be measurable with the TTR observation optical system, and driving of the relay lens within the TTR observation optical system in the optical axis direction of the projection optical system, and measurement, are performed in step S160. The sequence shown in FIG. 5 allows measurement to be completed in a shorter time than the sequence shown in FIG. 4.

In step S165, confirmation is made regarding whether measurement has been completed for all marks to be measured. In the event that measurement of all marks has not been completed, the reticle stage 4, the wafer stage 10, and object lens of the TTR observation optical system 20 are driven, and the flow returns to step S160.

Focal position measurement using the TTR observation optical system 20 has been described with the sequences shown in FIGS. 4 and 5. Measuring positional offset in the planar direction can be performed by matching the focal position of the reticle side mark and the wafer side mark according to FIGS. 4 and 5, and calculating the relative offset of the reticle side mark and the wafer side mark. Also, the planar direction positional offset of the reticle side mark can be obtained by calculating positional offset of the reticle side mark as to the measurement reference of the TTR observation optical system. Further, focal position measurement and planar direction positional offset measurement can be made with a measuring arrangement other than the TTR observation optical system, as well.

Fifth Embodiment

Figure 6:
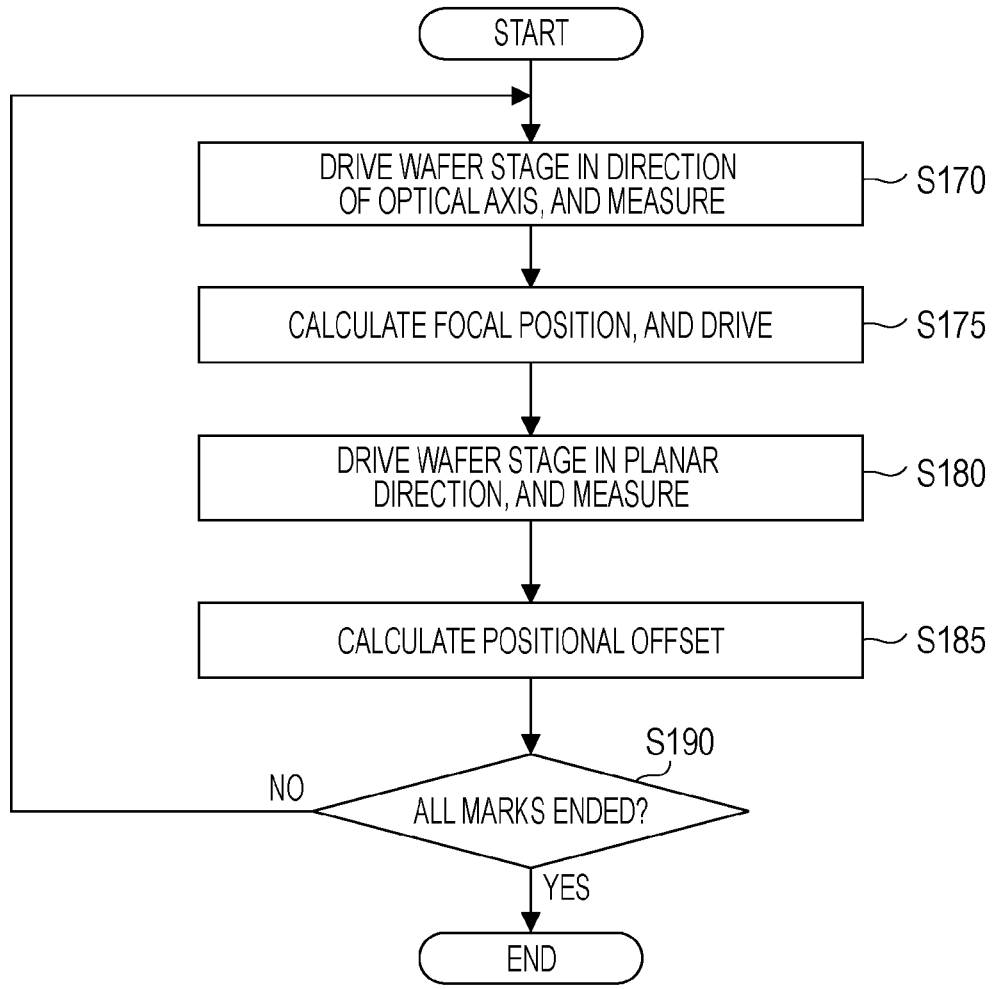
FIG. 6 is a diagram illustrating a measurement sequence using spatial image observation, according to a fifth embodiment of the present invention.

FIG. 6 is a description of a sequence carried out with regard to a configuration having a slit-type mark (second reference mark) corresponding to the reticle side mark formed at the stage reference plate 9, and a sensor. Exposure light is cast onto the reticle side mark with the illumination optical system, and the image formed on the stage reference plate via the projection light system 6 (first image) is used to measure the focal position and planar direction positional offset.

As preparations for measurement, a shielding plate within the illumination optical system for illuminating only the mark region to be measured, and the mark to be measured is driven to the measurement position (not shown in FIG. 6). In the case of measuring a mark on the reticle reference plate 3 (second image), the reticle reference plate and stage reference plate 9 are driven. In the case of measurement of the mark on the reticle 2 (first image), the mark on the reticle and the stage reference plate are driven.

In step S170, exposure light is cast on the reticle side mark while driving the wafer stage 10 in the direction of the optical axis, and accumulative measurement is made of the light quantity transmitted through the stage reference plate side slit.

In step S175, focal position calculation is performed, and Z driving (diving in the direction of the optical axis) of the wafer stage 10 to the focal position is performed.

In step S180, exposure light is cast on the reticle side mark while driving the wafer stage 10 in the planar direction, and accumulative measurement is made of the light quantity transmitted through the stage reference plate side slit.

In step S185, planar direction positional offset is calculated.

In step S190, completion of measurement of all marks is configured. In the event that measurement of all marks has not been completed, the reticle stage 2, the wafer stage 10, the shielding plate within the illumination optical system, and so forth, are driven, and the flow returns to step S170.

A measurement sequence has been described for focal position measurement and planar direction positional offset measurement, using the TTR observation optical system 20 and images formed on the stage reference plate 9. Note however, that separate measurement of the heat change amount of the reticle 2 and the heat change amount of the projection optical system 6, which is the essence of the present invention, can be made with other sequences, as long as the configuration is such that focal position measurement and planar direction positional offset measurement can be made via the reticle and projection optical system.

Next, a specific measurement method wherein a heat change coefficient of the projection optical system 6, and a heat change coefficient of the reticle 2, are separately measured, will be described by way of sixth and seventh embodiments.

Sixth Embodiment

Figure 7:
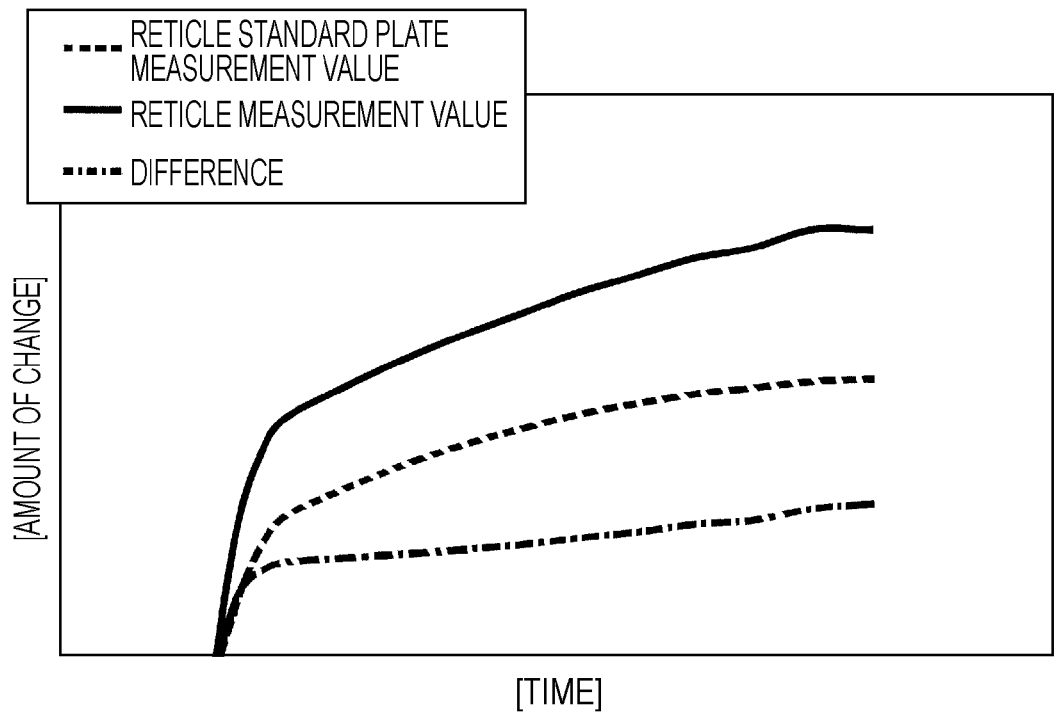
FIG. 7 is a diagram illustrating heat change, according to a sixth embodiment of the present invention.

FIG. 7 is a diagram illustrating heat change obtained by the reticle measurement and reticle reference plate measurement made according to the sequence shown in FIG. 2. The solid line in FIG. 7 indicates heat change obtained by reticle measurement, the dotted line indicates heat change obtained by reticle reference plate measurement, and the single-dot broken line indicates the difference between the reticle measurement value and the reticle reference plate measurement value, i.e., the heat change amount of the reticle 2.

The measurement values obtained by measuring the reticle mark include the amount of change where the reticle 2 has exhibited heat change, and the amount of change where the projection optical system 6 has exhibited heat change, so the following expression (the above-described Expression 1, only rephrased somewhat differently) holds.

Reticle measurement value=reticle heat change amount+projection optical system heat change amount  (Expression 1)

The measurement values obtained by measuring the reticle reference plate mark include the amount of change where the projection optical system 6 has exhibited heat change, so the following expression (the above-described Expression 2, only rephrased somewhat differently) holds.

Reticle reference plate measurement value=projection optical system heat change amount  (Expression 2)

From Expressions 1 and 2, we find that

Reticle heat change amount=reticle measurement value−reticle reference plate measurement value  (Expression 3)

holds.

Seventh Embodiment

Figure 8:
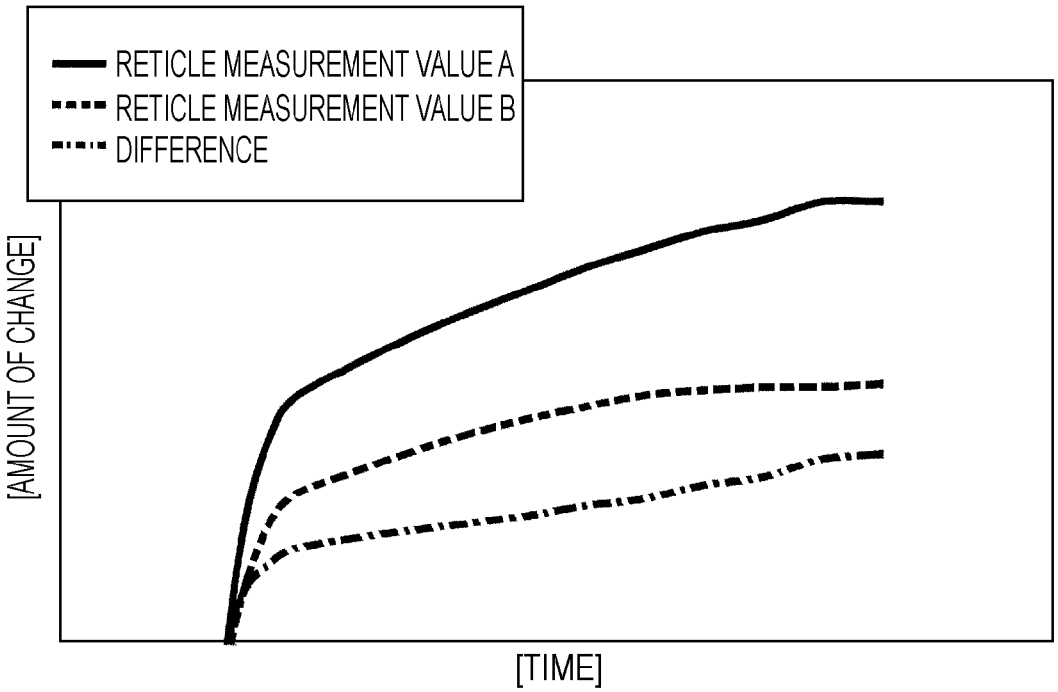
FIG. 8 is a diagram illustrating heat change, according to a seventh embodiment of the present invention.

FIG. 8 is a diagram illustrating heat change obtained by the reticle measurement with heat load (hereafter referred to as reticle measurement A) and reticle measurement without heat load (hereafter referred to as reticle measurement B) made according to the sequence shown in FIG. 3. The solid line in FIG. 7 indicates heat change obtained by reticle measurement A, the dotted line indicates heat change obtained by reticle measurement B, and the single-dot broken line indicates the difference between the reticle measurement A and the reticle measurement B, i.e., the heat change amount of the reticle.

The measurement values obtained by reticle measurement A include the amount of change where the reticle 2 has exhibited heat change, and the amount of change where the projection optical system 6 has exhibited heat change, so the following expression (the above-described Expression 4, only rephrased somewhat differently) holds.

Reticle measurement A=reticle heat change amount+projection optical system heat change amount  (Expression 4)

The measurement values obtained by reticle measurement B include the amount of change where the projection optical system 6 has exhibited heat change, so the following expression (the above-described Expression 5, only rephrased somewhat differently) holds.

Reticle measurement B=projection optical system heat change amount (Expression 5)

From Expressions 4 and 5, we find that

Reticle heat change amount=reticle measurement A−reticle measurement B (Expression 6)

holds.

As can be seen from FIGS. 7 and 8, the heat change amount of the reticle obtained from Expressions 3 and 6 exhibits an exponential curve wherein the horizontal axis is time and the vertical axis is the amount of change.

The amount of heat change is obtained separately for the reticle 2 and the projection optical system 6, so the amount of change for each time can be modeled. A model expression for thermal expansion should be an expression reflecting the amount of time subjected to heat load, a time constant, the thermal expansion coefficient of the object which exhibits heat change, and so forth. A model expression for thermal contraction should be an expression reflecting the amount of time not subjected to heat load, a time constant, the thermal expansion coefficient of the object which exhibits heat change, and so forth.

Eighth Embodiment

With the eighth embodiment of the present invention, a specific correction method for calculating the amount of correction from the heat change coefficient of the projection optical system 6 and the heat change coefficient of the reticle 2, and performing correction, will be described.

Figure 9:
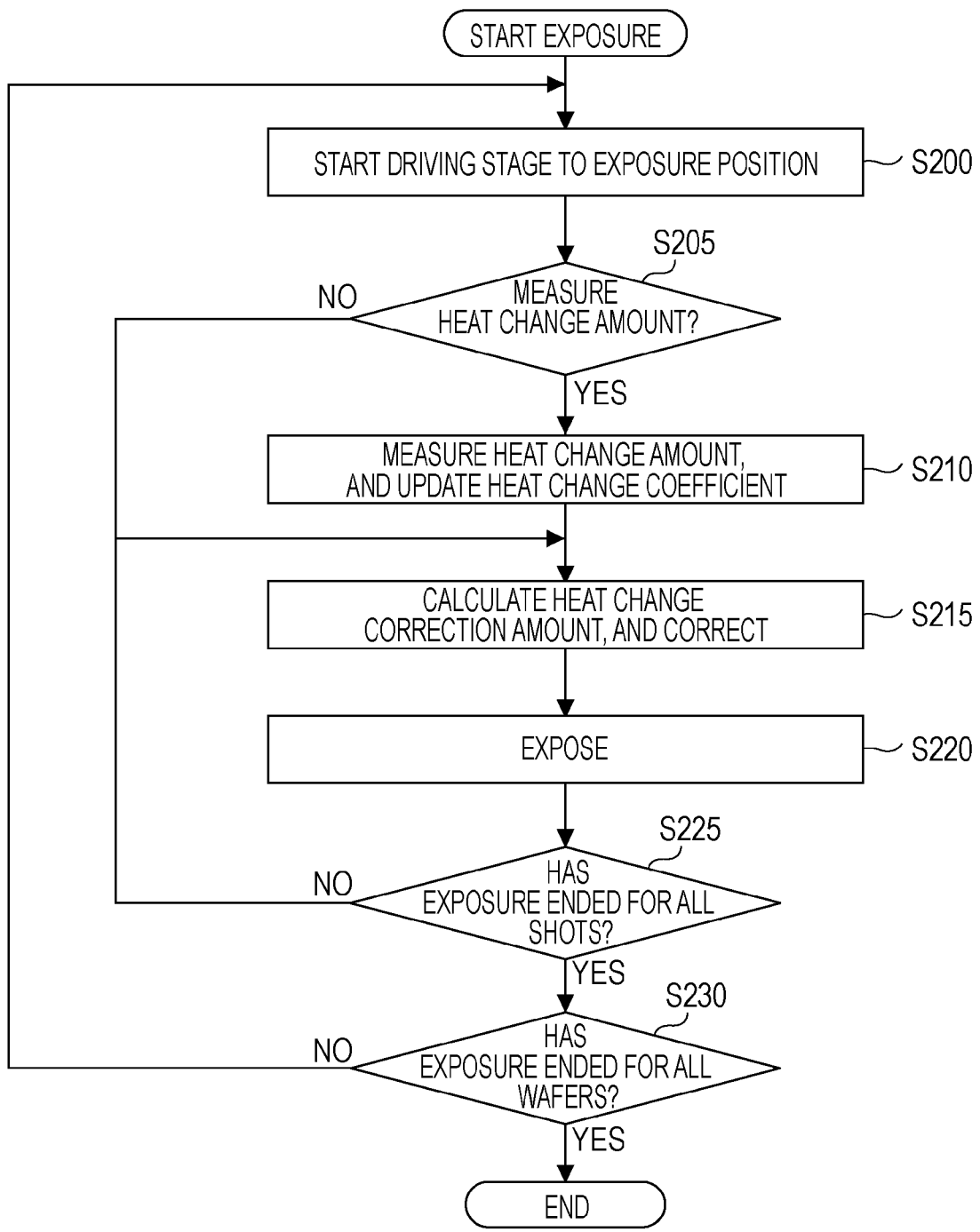
FIG. 9 is a diagram illustrating an exposure sequence including heat change correction, according to an eighth embodiment of the present invention.

FIG. 9 is a diagram illustrating an exposure sequence wherein heat change is corrected, and exposure processing is performed. Note that at the time of starting exposure, preparations necessary for exposure (carrying in of wafers and reticles into the apparatus, driving of the units to illumination conditions for performing the exposure processing, etc.) have already been performed, and accordingly are not shown in FIG. 9.

In step S200, the wafer stage 10 and the reticle stage 4 are driven to the exposure position.

In step S205, confirmation is made regarding whether or not to perform heat change amount measurement of the reticle 2 or the projection optical system 6. This heat change amount measurement may be performed periodically and the apparatus set accordingly, or the apparatus may automatically determine whether or not to perform the heat change amount measurement based on the amount of time elapsed from the last heat change amount measurement, or the heat change amount measurement may be performed at a certain timing for measurement within each process, taking into consideration the process margin.

In step S210, heat change measurement is performed. In the case of updating the heat change coefficients of the reticle 2 and the projection optical system 6, the reticle mark measurement and reticle reference plate mark measurement should be executed. In the case of updating the heat change coefficient of the projection optical system, reticle reference plate mark measurement alone is sufficient. In the case of updating the heat change coefficient of sum of the reticle and projection optical system, the reticle mark measurement alone is sufficient.

In step S215, calculation of the heat change correction amount, and correction, are performed. If this step S215 is being performed immediately following the heat change amount measurement in step S210, heat change correction may be made deeming the measurement value and the correction value to be the same. Otherwise, the amount of correction is calculated with a change model expression reflecting heat change coefficients.

When updating heat change coefficients, a heat change amount predicted by calculation before measurement, and the measurement value obtained by measurement are compared, and in the event that the difference is small, determination is made that the heat change coefficient is correct, so the heat change coefficient is not updated. A threshold may be set, such that in the event that the difference exceeds this threshold, the difference is determined to be great, or a threshold may be set for each process, taking into consideration the process margin. In the event that the difference exceeds to the threshold, the heat change coefficients may be updated by changing the time constant in the heat change model expression, or the coefficients itself may be changed.

Heat change correction may be performed by any one of, or a combination of any of: changing light source wavelength, changing the optical axis direction position or horizontal direction position of the wafer stage or reticle stage, driving a correcting lens within the projection optical system 6, and changing the relative scanning speed between the wafer stage 10 and the reticle stage 4. The specific way of correcting should be determined taking into consideration the correction precision and time required for correction, in light of the calculated correction amount.

In step S220, exposure processing is performed.

In step S225, whether or not exposure has been completed for all shots within the wafer is confirmed. In the event that exposure has not been completed for all shots, preparation is made for exposure of the next shot, and the flow returns to step S215.

In step S230, whether or not exposure has been completed for all wafers is confirmed. In the event that exposure has not been completed for all wafers, preparation is made for exposure of the next wafer, and the flow returns to step S200.

Ninth Embodiment

With the ninth embodiment of the present invention, a specific correction method for calculating the amount of correction from the heat change coefficient of the projection optical system 6 and the heat change coefficient of the reticle 2, and performing correction, will be described.

Figure 10:
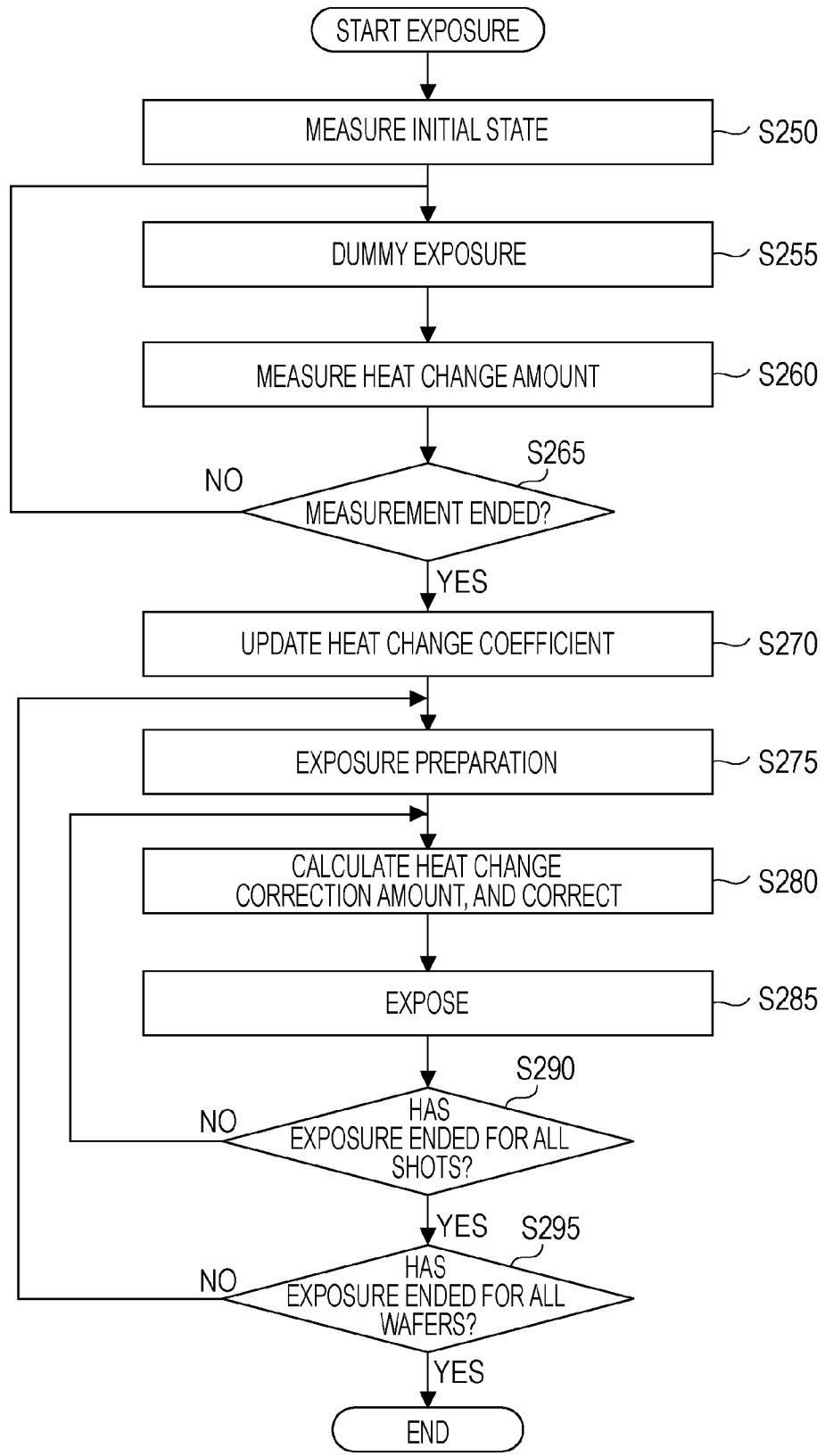
FIG. 10 is a diagram illustrating an exposure sequence including heat change coefficient updating, according to a ninth embodiment of the present invention.

FIG. 10 is a diagram illustrating an exposure sequence wherein heat change is corrected, and exposure processing is performed. Note that at the time of starting exposure, preparations necessary for exposure (carrying in of wafers and reticles into the apparatus, driving of the units to illumination conditions for performing the exposure processing, etc.) have already been performed, and accordingly are not shown in FIG. 10.

In step S250, the heat change amount of the reticle 2 and the projection optical system 6 in the initial state is measured. In this case, the initial state is to be measured, so the reticle 2 should be left suctioned to the reticle stage 4 for a predetermined amount of time, such that all changes in the reticle due to the temperature within the apparatus are completely finished. The projection optical system also is to be measured with no heat load, so the projection optical system should be left standing a sufficient amount of time such that the lenses of the projection optical system are in the initial state.

Note however, that the heat change of the projection optical system 6 and the heat change of the reticle 2 are obtained separately, so even in the event that the heat change is measured in a state wherein the projection optical system is under heat load, the initial state of the reticle heat change can be measured with high precision. The measurement to be performed here is measurement of the reticle mark and reticle reference plate mark, described in the first embodiment.

In step S255, dummy exposure is performed. Dummy exposure is performed to cause heat change at the reticle 2 and the projection optical system 6, not to expose the wafer 8. The exposure duty at this time is to cause heat change, and accordingly, a higher duty than normal exposure at this time will increase the heat change, so measurement for obtaining heat change coefficients can be obtained in a short time.

In step S260, the heat change amount following dummy exposure is measured. This is the same measurement as that which has already been described in step S250, so description will be omitted here.

In step S265, confirmation is made that measurement has been completed. Completion of measurement means that measurement necessary for calculation of the heat change coefficients of the reticle 2 and the projection optical system 6, for which the measurement is performed, has been completed. In the event that measurement has not been completed, the flow returns to step S255.

In step S270, heat change coefficients are calculated and updated. Calculation of heat change coefficients is the same as that which has already been described above in the sixth and seventh embodiments, so description will be omitted here.

In step S275, exposure preparation for process exposure is performed. Exposure preparations include carrying in of wafers to be exposed to the wafer stage 10, and driving of the reticle stage 4 and wafer stage to the exposure position.

In step S280, calculation of heat change correction amount, and correction, are performed. Calculation of heat change amount and correction are the same as that which has already been described above in the eighth embodiment, so description will be omitted here.

In step S285, exposure processing is performed.

In step S290, whether or not exposure has been completed for all shots within the wafer 8 is confirmed. In the event that exposure has not been completed for all shots, preparation is made for exposure of the next shot, and the flow returns to step S280.

In step S295, whether or not exposure has been completed for all wafers is confirmed. In the event that exposure has not been completed for all wafers, preparation is made for exposure of the next wafer, and the flow returns to step S275.

Examples of exposure sequences have been described in the above embodiments, describing a specific correction method for calculating correction amount from the heat change coefficient of the projection optical system 6 and the heat change coefficient of the reticle 2 in the sequences. However, it should be noted that application of the present invention is not restricted to the sequences given with relation to the eighth and ninth embodiments. In a case wherein the heat change coefficient of the projection optical system and the heat change coefficient of the reticle have been obtained before starting exposure, performing calculation of the heat change correction amount, and correction thereof, immediately before exposure processing, is sufficient.

According to the above-described embodiments, heat change of the reticle 2 and the projection optical system 6 can be measured separately and corrected separately, so heat change of the reticle and projection optical system due to exposure can constantly be corrected with high precision for exposure processing.

Also, heat change of the reticle 2 and the projection optical system 6 can be calculated separately, and thermal deformation of the reticle and projection optical system can be predicted and corrected, so correction measurement processing during the exposure processing can be done away with or the number of times thereof can be reduced, meaning that the exposure apparatus can be operated efficiently.

Tenth Embodiment

Figure 11:
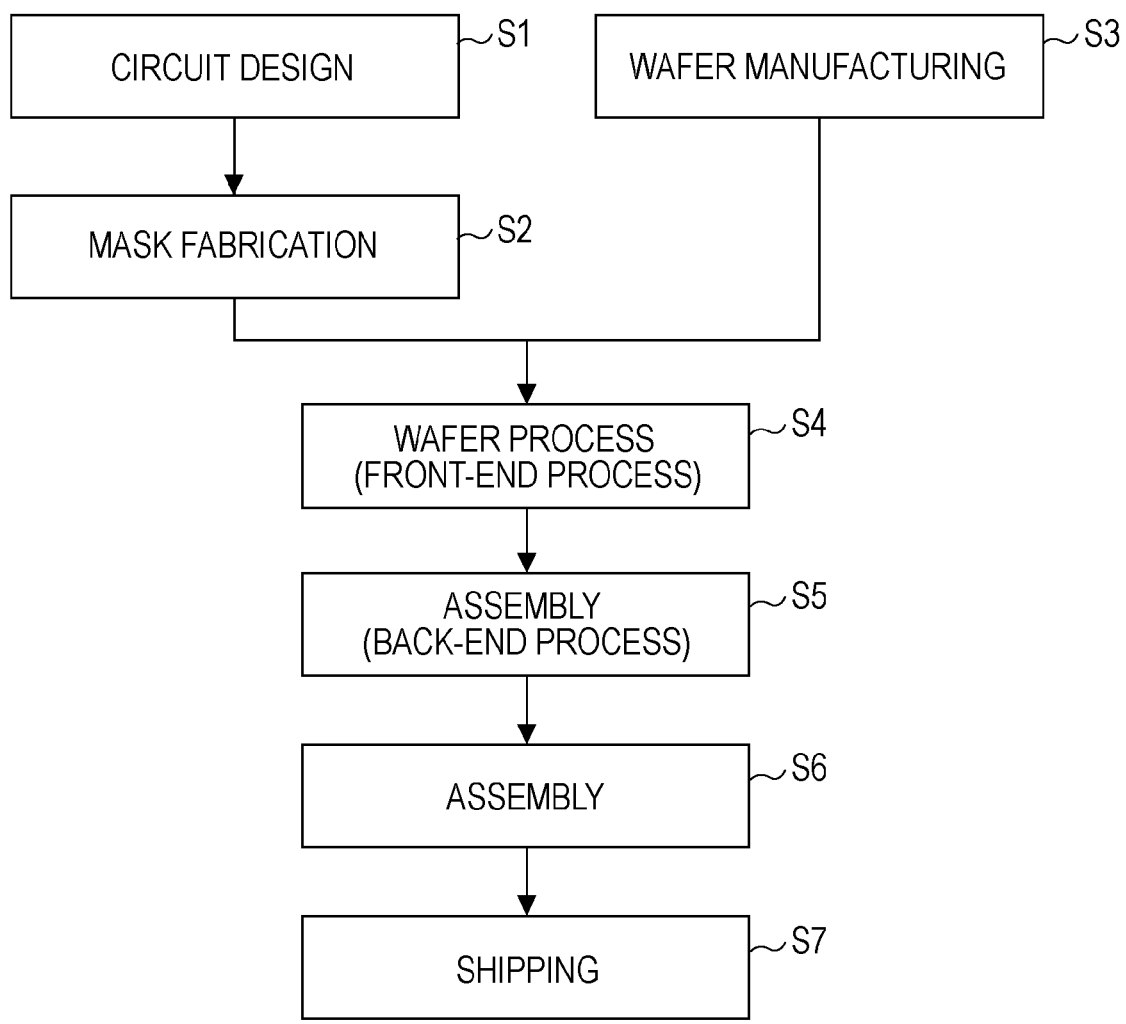
FIG. 11 is a diagram illustrating the flow of a device manufacturing process, according to a tenth embodiment of the present invention.

The following is a description of a manufacturing process for minute devices (semiconductor chips (such as ICs, LSIs, and the like), liquid crystal panels, CCDs, thin-film magnetic heads, micro-machines, and so forth.) using the exposure apparatus according to any one of the above embodiments. FIG. 11 illustrates the flow of manufacturing semiconductor devices.

In step S1 (circuit design), circuit design is preformed for the semiconductor device.

In step S2 (mask fabrication), a mask (also known as an original or reticle) is fabricated having formed therein the designed pattern.

In step S3 (wafer fabrication), a wafer is made using a material such as silicon.

In step S4 (wafer process), which is a process also called "front-end process", the mask fabricated as described above and the wafer are set in the exposure apparatus, and actual circuits are formed on the wafer using photolithography.

In step S5 (assembly), which is a process also called "back-end process", the wafer upon which the circuits have been formed in step S4 is used to make semiconductor chips. The back-end process includes assembling processes such as dicing, bonding, and packaging (sealing of the chip).

In step S6 (inspection), the semiconductor device fabricated in step s5 is subjected to inspection such as operation confirmation tests, durability tests, and so forth.

In step S7, the semiconductor devices which have passed through the above steps are complete, and are shipped.

Note that the wafer process in the above step S4 includes an oxidation step for oxidizing the surface of the water, a CVD (chemical vapor deposition) step for forming an insulating film on the wafer surface, and an electrode forming step for forming electrodes on the wafer by vapor deposition. Also included are an ion implantation step for implanting ions in the wafer, a resist processing step wherein the wafer is coated with a photosensitive agent, and an exposure step wherein the wafer following the resist processing step is exposed using the mask having the circuit pattern, fabricated in the mask fabrication step, so as to form a latent image on the wafer (preparatory step). Further included are a developing step for developing the wafer in the exposing step (developing step), an etching step for etching away portions other than the resist image developed in the developing step, and a resist peeling step for removing the unnecessary resist following the etching. Repeating these steps enables a multi-layer circuit pattern to be formed on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-245403 filed Sep. 11, 2006, which is hereby incorporated by reference herein in its entirety.

What is claimed is:

1. An exposure apparatus configured to perform an exposure of a substrate to light via an original, the apparatus comprising:
   a projection optical system configured to project light from the original onto the substrate;
   an original stage having a first reference mark and configured to hold the original and to be moved;
   a substrate stage configured to hold the substrate and to be moved;
   an optical system configured to form and pick up a first image of a mark, formed on the original held by the original stage, via the projection optical system, and to form and pick up a second image of the first reference mark via the projection optical system; and
   a controller configured to obtain a first coefficient of a change in a property of an image formed via the projection optical system due to a change in heat amount of the projection optical system based on the picked up first image, to obtain a second coefficient of a change in a property of an image formed via the projection optical system due to a change in heat amount of the original based on the picked up first image and the picked up second image, to obtain the change in the property with respect to each of the projection optical system and the original based on an amount of time subjected to heat load, due to the exposure, to corresponding one of the projection optical system and the original and corresponding one of the calculated first coefficient and the calculated second coefficient, and to control compensation for the change in the property obtained with respect to each of the projection optical system and the original.

2. The exposure apparatus according to claim 1, wherein the substrate stage has a second reference mark, and
   wherein the optical system is configured to form each of the first image and the second image via the second reference mark.

3. The exposure apparatus according to claim 1, wherein the property of the image includes at least one of focus, shift, tilt, and aberration of the image.

4. The exposure apparatus according to claim 1, wherein the apparatus is configured to compensate for the change in the property by performing at least one of:
   changing a wavelength of the light;
   changing a position of the original stage;
   changing a position of the substrate stage;
   driving an optical element included in the projection optical system; and
   changing a relative scanning speed between the original stage and the substrate stage.

* * * * *